United States Patent
Kano et al.

(10) Patent No.: US 7,943,199 B2
(45) Date of Patent: May 17, 2011

(54) METHOD OF PRODUCING METAL PLATED MATERIAL, METAL PLATED MATERIAL, METHOD OF PRODUCING METAL PATTERN MATERIAL, AND METAL PATTERN MATERIAL

(75) Inventors: Takeyoshi Kano, Kanagawa (JP); Kazuki Yamazaki, Kanagawa (JP); Masataka Sato, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/426,293

(22) Filed: Apr. 20, 2009

(65) Prior Publication Data

US 2009/0269561 A1  Oct. 29, 2009

(30) Foreign Application Priority Data

Apr. 23, 2008 (JP) ................. 2008-113126

(51) Int. Cl.
- *B05D 3/02* (2006.01)
- *B05D 1/36* (2006.01)
- *B05D 1/18* (2006.01)
- *C23C 28/00* (2006.01)
- *C23C 20/02* (2006.01)

(52) U.S. Cl. .............. 427/384; 427/402; 427/407.1; 427/443.1; 205/183; 205/187; 205/188

(58) Field of Classification Search ............ 427/384, 427/402, 407.1, 443.1; 205/183, 187, 188
See application file for complete search history.

(56) References Cited

U.S. PATENT DOCUMENTS

| 4,396,679 A | * | 8/1983 | Gaku et al. | ......... 428/412 |
| 6,479,374 B1 | * | 11/2002 | Ioka et al. | ......... 438/601 |

FOREIGN PATENT DOCUMENTS

| JP | 11-12504 | 1/1999 |
| WO | WO 2005053368 A1 * | 6/2005 |

* cited by examiner

*Primary Examiner* — Edna Wong
(74) *Attorney, Agent, or Firm* — Solaris Intellectual Property Group, PLLC

(57) ABSTRACT

A method of producing a metal plated material, the method including: preparing a polymer solution containing a polymer; preparing a composition by mixing the polymer solution with a monomer at an amount of from 30% by mass to 200% by mass with respect to the polymer, at least one of the polymer or the monomer having a non-dissociative functional group that interacts with a plating catalyst or a precursor thereof, forming a cured layer on a substrate by applying the composition, drying the composition and curing the composition; applying the plating catalyst or the precursor thereof to the cured layer; and conducting plating with respect to the plating catalyst or the precursor thereof to form a plating film on the cured layer.

10 Claims, No Drawings

METHOD OF PRODUCING METAL PLATED MATERIAL, METAL PLATED MATERIAL, METHOD OF PRODUCING METAL PATTERN MATERIAL, AND METAL PATTERN MATERIAL

CROSS-REFERENCE TO RELATED APPLICATION

This application claims priority under 35 USC 119 from Japanese Patent Application No. 2008-113126, filed Apr. 23, 2008, the disclosure of which is incorporated by reference herein.

BACKGROUND OF THE INVENTION

1. Field of the Invention

The present invention relates to a method of producing a metal plated material, a metal plated material, a method of producing a metal pattern material, and a metal pattern material.

2. Description of the Related Art

Conventionally, substrates having wiring including a metal pattern formed on a surface of an insulating support (metal pattern material) have been widely used for electronic members or semiconductor devices.

The metal pattern material is mainly produced by a "subtractive method". The subtractive method includes forming a photosensitive layer, which is sensitized by irradiating with actinic rays, on a metal film formed on a surface of a substrate; exposing the photosensitive layer to light in an image-wise manner; developing the photosensitive layer to form a resist image; etching the metal film to form a metal pattern; and peeling off the resist from the metal pattern.

In the above method, the substrate and the metal film are tightly adhered to each other by means of an anchoring effect generated by providing irregularities on the surface of the substrate. Therefore, there is a problem in that high frequency characteristics of metal wiring including the metal pattern may deteriorate due to the irregularities of the metal pattern at an interface with the substrate. Further, since the surface of the substrate needs to be treated with a strong acid such as chromic acid for roughening, it is necessary to perform a complicated process in order to obtain a metal pattern having excellent adhesiveness between a metal film and a substrate.

In order to address the aforementioned problem, Japanese Patent Application Laid-Open (JP-A) No. 11-12504 proposes a method including forming a cured layer containing a polymer having a chelating ligand capable of trapping metal ions that serve as a plating catalyst, and plating the cured layer. In this method, a composition prepared by mixing the polymer and a curable agent is used for the formation of the cured layer. However, the stability over time of the compound prepared by the above process may be insufficient, and the compound may not form a uniform cured layer. Further, all examples of the chelating ligand disclosed in JP-A No. 11-12504, including carboxylic acid-type ligands represented by iminodiacetic acid, azo-type ligands, polyamine-type or polyimine-type ligands, alcoholic or phenolic hydroxyl-type ligands, and β-diketone-type ligands, are hydrophilic. Therefore, there are problems in that absorption or desorption of moisture tends to occur due to changes in humidity or temperature, or the metal film tends to exfoliate from the substrate. Moreover, when the metal pattern material obtained by the above method is used for wiring of the metal wiring substrate, a graft polymer having a polar group remains at an interface with the substrate to promote retention of moisture or ions. Therefore, there are concerns regarding unfavorable influence of temperature or humidity, resistance to ion migration between the wiring, or deformation of the wiring lines. In particular, when the metal pattern material is used for fine wiring of a print wiring substrate or the like, insulating properties between wiring (metal pattern) lines need to be improved. Accordingly, further improvement in reliability of insulating properties among the wiring is demanded.

SUMMARY OF THE INVENTION

A first aspect of the invention provides a method of producing a metal plated material, the method comprising:

preparing a polymer solution containing a polymer;

preparing a composition by mixing the polymer solution with a monomer at an amount of from 30% by mass to 200% by mass with respect to the polymer, at least one of the polymer or the monomer having a non-dissociative functional group that interacts with a plating catalyst or a precursor thereof, forming a cured layer on a substrate by applying the composition, drying the composition and curing the composition;

applying the plating catalyst or the precursor thereof to the cured layer; and conducting plating with respect to the plating catalyst or the precursor thereof to form a plating film on the cured layer.

A second aspect of the invention provides a method of producing a metal plated material, the method comprising:

preparing a polymer solution containing a polymer;

preparing a composition by mixing the polymer solution with a monomer at an amount of from 30% by mass to 200% by mass with respect to the polymer, and a compound having a non-dissociative functional group and a reactive group, the non-dissociative functional group being capable of interacting with a plating catalyst or a precursor thereof, and at least one of the polymer or the monomer having a functional group that reacts with the reactive group in the compound;

forming a cured layer on a substrate by applying the composition, drying the composition and curing the composition;

applying the plating catalyst or the precursor thereof to the cured layer; and conducting plating with respect to the plating catalyst or the precursor thereof to form a plating film on the cured layer.

DETAILED DESCRIPTION OF THE INVENTION

<Method of Producing Metal Plated Material and Metal Pattern Material>

The first method of producing a metal plated material of the invention (hereinafter, referred to as Method (I) sometimes) includes:

(1) preparing a polymer solution containing a polymer;

(2a) preparing a composition by mixing the polymer solution with a monomer at an amount of from 30% by mass to 200% by mass with respect to the polymer, at least one of the polymer or the monomer having a non-dissociative functional group that interacts with a plating catalyst or a precursor thereof, (3) forming a cured layer on a substrate by applying the composition, drying the composition and curing the composition;

(4) applying the plating catalyst or the precursor thereof to the cured layer; and (5) conducting plating with respect to the plating catalyst or the precursor thereof to form a plating film on the cured layer.

The second method of producing a metal plated material of the invention (hereinafter, referred to as Method (II) sometimes) includes:

(1) preparing a polymer solution containing a polymer;

(2b) preparing a composition by mixing the polymer solution with a monomer at an amount of from 30% by mass to 200% by mass with respect to the polymer, and a compound having a non-dissociative functional group and a reactive group, the non-dissociative functional group being capable of interacting with a plating catalyst or a precursor thereof, and at least one of the polymer or the monomer having a functional group that reacts with the reactive group in the compound;

(3) forming a cured layer on a substrate by applying the composition, drying the composition and curing the composition;

(4) applying the plating catalyst or the precursor thereof to the cured layer; and (5) conducting plating with respect to the plating catalyst or the precursor thereof to form a plating film on the cured layer.

A method of producing a metal pattern material of the invention includes:

(6) etching the film formed by the plating in the aforementioned Method I or Method II. Specifically, the method of producing a metal pattern material of the invention includes step (6), in which etching is conducted after steps (1), (2a) or (2b), (3) and (5).

In the method of producing a metal plated material or a metal pattern material of the invention, a cured layer is formed on a substrate by applying a composition containing a polymer and a monomer onto the substrate and drying it. Since the curable layer is formed by causing reaction on the substrate, it has excellent adhesion to the substrate. Further, since at least one of the polymer or monomer used for the formation of the cured layer has a non-dissociative group (hereinafter, referred to as an "interactive group" sometimes) that interacts with the plating catalyst or the precursor thereof, a metal film having excellent adhesion to the curable layer may be obtained by applying the plating catalyst or the precursor thereof to the curable layer and conducting plating.

Further, when a substrate having a polymerization initiation layer is used, the curable layer (or the polymer included therein) can be directly chemically bonded to the substrate, and a metal film having even higher adhesion to the substrate may be obtained.

Consequently, the metal plated material and metal pattern obtained in the above method has a metal layer having excellent adhesion to the substrate.

Moreover, in the formation of the cured layer, the composition is prepared by mixing the polymer solution that has been prepared in step (1) with the monomer in steps (2a) or (2b). Further, since the composition is prepared before (or immediately before) step (3), stability over time of the composition may be improved and, as a result, the cured layer having in-plane uniformity may be formed. Accordingly, the metal film or metal pattern formed on the cured layer may achieve adhesion to the substrate and in-plane uniformity.

As mentioned above, the cured layer of the invention is formed from the polymer or monomer that contains an interactive group. Since this interactive group in the cured layer functions as a non-dissociative functional group, a cured layer having excellent interaction properties with respect to the plating catalyst or a precursor thereof may be obtained. Further, a cured layer having low water absorbency and high hydrophobicity even at high temperature and high humidity may be obtained.

In view of the above, the metal plated material obtained by the above method has a metal film having excellent adhesion to the substrate. Further, since the cured layer is hardly denatured changes in humidity, changes in the adhesion of the cured layer in response to changes in humidity may be suppressed. The metal-coated material having such properties as mentioned above is applicable not only for an electric wiring material by subjecting the metal plated material to the later-described method of producing a metal pattern material, but also for electromagnetic wave protection films, shielding materials, or the like.

Further, in the method of producing a metal pattern material, a metal pattern is obtained by etching the plating film that has been formed on the whole surface of the substrate in a patterned manner. In this process, when the cured layer is exposed at a portion to which a metal pattern is not formed, water absorption at the exposed portion may be suppressed and degradation in insulating properties due to the above may be suppressed. As a result, the metal pattern material obtained by the method of producing a metal pattern material of the invention exhibits excellent insulation reliability at a portion at which a metal pattern is not formed.

In the following, each process of the methods of producing a metal plated material of the invention (Methods I and II) will be described.

Step (1)

In step (1) of the method of producing a metal plated material of the invention (Methods I and II), a polymer solution containing a polymer is prepared. Details of the polymer used in this step will be described later.

The concentration of the polymer in the polymer solution is preferably 1 to 30% by mass, more preferably 5 to 20% by mass, from the viewpoint of coatability.

In preparing the polymer solution, it may be preferable that the compound that is to be mixed with the polymer solution in the next step is dissolved in a solvent (in the form of a solution) prior to the mixing, depending on the solubility of the compound (such as the monomer or a compound containing an interactive group). In this case, the polymer solution is preferably prepared so as to give a higher concentration than that of the resultant composition. Specifically, the polymer solution is preferably prepared at a concentration at which the compound to be mixed with in the next step, being contained in a solution at a concentration of 10 to 50% by mass, can be dissolved. When sufficient storage stability of the polymer solution are not achieved when the concentration of the polymer is too high, it is possible to prepare the polymer solution at a concentration that does not affect the storage stability while being stored, and adjust the concentration by evaporating the solvent immediately prior to the application.

Steps (2a) and (2b)

In step (2a), a composition is prepared by mixing the polymer solution with a monomer at an amount of 30% by mass to 200% by mass.

In step (2b), a composition is prepared by mixing the polymer solution with a monomer at an amount of 30% by mass to 200% by mass to prepare a composition, and a compound having a reactive group and a non-dissociative functional group that interacts with a plating catalyst or a derivative thereof that will be applied in a later step (hereinafter, referred to as "interactive group-containing compound" sometimes).

The monomer (step (2a)) or the monomer and the interactive group-containing compound (step (2b)) is preferably in the form of a solution upon mixing with the polymer solution.

In this solution, the total content of the monomer or the interactive group-containing composition is preferably 10% by mass to 50% by mass.

The solvent used for preparing the above solution may be the same as the solvent used in step (1) to prepare the polymer solution, or may be different.

Further, the composition prepared in this step is preferably prepared not very long before using the composition. For example, the composition is preferably used within one week from the preparation.

In this step, the content of the monomer to be mixed with is 30% by mass to 200% by mass with respect to the mass of the polymer. When the content is less than 30% by mass, formation of a film may not be sufficiently carried out. When the content is more than 200% by mass, the film thus formed may become sticky and less handleable, and a crosslinking rate of the film after curing may be too high to readily cause adsorption of the plating catalyst or the like in the subsequent step. The content of the monomer to be mixed with is preferably 30% by mass to 130% by mass, more preferably 30% by mass to 100% by mass, with respect to the mass of the polymer.

The ratio of the monomer in the composition is preferably determined so that the ratio of a polymerizable group per gram of a film that has been formed by applying the composition and drying is 2.0 mmol/g or more, more preferably 4.0 mmol/g or more. When the ratio is less than 2.0 mmol/g, sufficient curing properties may not be achieved. Further, the ratio of the interactive group per gram of a film that has been formed by applying the composition and drying is preferably 2.0 mmol/g or more, more preferably 3.0 mmol/g or more.

In this step, the content of the interactive group-containing compound in the composition is preferably determined so that the amount of the interactive group in the cured layer is within the above range. Specifically, although it depends on the molecular weight of the interactive group-containing compound, the content thereof is preferably 20% by mass to 150% by mass, more preferably 50% by mass to 120% by mass, with respect to the total solid content of the components excluding the interactive group-containing compound. When the content of the interactive group-containing compound is within the above range, it may be possible to control the amount of the interactive group in the cured layer to adsorb the plating catalyst or the like in a desired manner, and form a metal film (plating film) that exhibits high adhesion.

In this step, a photopolymerization initiator may be added to the composition in order to improve the curing properties. The type of the photopolymerization is not particularly limited as long as it is active with respect to actinic rays used in the irradiation and generates an active species. Examples of the photopolymerization initiator include radical polymerization initiators, anionic polymerization initiators, cationic polymerization initiators or the like, but radical polymerization initiators and cationic polymerization initiators are preferable in view of handleability or reactivity. Among these, radical polymerization initiators are most preferable.

Specific examples of the photopolymerization initiator include acetophenones such as p-tert-butyltrichloro acetophenone, 2,2'-diethoxy acetophenone, and 2-hydroxy-2-methyl-1-phenyl propan-1-one; ketones such as benzophenone, 4,4'-bisdimethylaminobenzophenone, 2-chlorothioxanthone, 2-methylthioxanthone, 2-ethylthioxanthone, and 2-isopropylthioxanthone; benzoin ethers such as benzoin, benzoin methyl ether, benzoin isopropyl ether, and benzoin isobutyl ether; benzyl ketals such as benzyl dimethyl ketal and hydroxycyclohexyl phenyl ketone; sulfonium salts such as triphenyl sulfonium chloride and triphenyl sulfonium pentafluorophosphate; and iodonium salts such as diphenyl iodonium chloride and diphenyl iodonium sulfate.

The content of the photopolymerization initiator is preferably 0.1% by mass to 30% by mass, more preferably 1% by mass to 20% by mass.

Combination of Polymer, Monomer and Interactive Group-Containing Compound

The polymer used in the invention preferably has no polymerizable group in view of stability over time of the composition. The "polymer having no polymerizable group" refers to a polymer that exhibits an integration value in a range of from 7 to 5.5 ppm, at which an olefin part is observed in $^1$H-NMR measurement, of less than 1% with respect to an integration value in a range excluding the above. In this case, even if a polymerizable group that may be introduced by chain transfer or the like is contained in the polymer, the amount of the polymerizable group is considered to be small enough.

Combination of Polymer, Monomer and Interactive Group-Containing Compound in Method I In Method I of the invention, a polymer having an interactive group or a polymer having no interactive group is used in step (1).

The interactive group in the invention has a function of interacting with a plating catalyst or a precursor thereof. The type of the interactive group is not limited as long as it is a non-dissociative functional group (a functional group that does not generate a proton by dissociation), and examples thereof include a group capable of polydentate coordination, a nitrogen-containing functional group, a sulfur-containing functional group, and an oxygen-containing functional group.

By using a non-dissociative functional group as mentioned above, absorption of water or moisture by the cured layer may be suppressed.

Examples of the interactive group in the invention include a group capable of coordinating with a metal ion. Specific examples thereof include nitrogen-containing functional groups such as an imide group, a pyridine group, a tertiary amino group, an ammonium group, a pyrrolidone group, an amidino group, a group containing a triazine ring structure, a group containing an isocyanuric structure, a nitro group, a nitroso group, an azo group, a diazo group, an azide group, a cyano group and a cyanate (R—O—CN) group; oxygen-containing functional groups such as an ether group, a group containing an N-oxide structure, a group containing an S-oxide structure and a group containing an N-hydroxy structure; sulfur-containing functional groups such as a thioether group, a thioxy group, a sulfoxide group, a sulfonic group, a sulfite group, a group containing a sulfoximine structure, a group containing a sulfoxonium salt structure, and a group containing a sulfonic acid ester structure; phosphorus-containing functional groups such as a phosphine group; and groups containing an unsaturated ethylenic bond. An imidazole group, a urea group or a thiourea group are also applicable if the group acts as a non-dissociative functional group with respect to an adjacent atom or atomic group.

Among them, an ether group (more specifically, a group having a structure represented by —O—$(CH_2)_n$—O— where n is an integer of from 1 to 5) or a cyano group is particularly preferred from the viewpoint of having high polarity and high adsorption capacity to a plating catalyst or the like, and a cyano group is most preferred.

In general, as the polarity increases, the water absorption rate tends to increase. However, since a cyano group interacts with other cyano groups so as to cancel the polarity of each other in the cured layer, the film becomes dense and the polarity of the cured layer as a whole decreases, thereby reducing the water absorbancy. Further, since the catalyst is adsorbed by a good solvent used for the cured layer, the cyano groups are solvated to cancel the interaction between them, thereby enabling the cyano groups to interact with the plating catalyst. For the above reasons, the cured layer preferably contains a cyano group in order to achieve both of the contradicting properties of low water absorbency and favorable interaction with a plating catalyst.

The interactive group according to the invention is more preferably an alkylcyano group. This is because when the cyano group is bonded to an aromatic ring, electrons are attracted to the aromatic ring to decrease the donating property of unpaired electrons that play an important role for the adsorbability to a plating catalyst or the like. Therefore, an alkylcyano group, which is not bonded to an aromatic ring, is preferable in view of adsorbability to a plating catalyst or the like.

The type of the polymer having no interactive group used in step (1) of Method I is not particularly limited, but a polymer having an acrylic structure in the main chain (acrylic resin), having flexibility, is preferable in view of such properties of the cured layer as adsorption of a plating catalyst or adhesion to a metal film formed thereon. Specific examples of the polymer having an acrylic structure include polyalkyl acrylates such as poly(methyl acrylate), poly(ethyl acrylate), poly (n-butyl acrylate), poly(t-butyl acrylate), poly(pentyl acrylate), and poly(2-ethylhexyl acrylate).

The type of the polymer having an interactive group used in step (1) of Method I is not particularly limited as long as the polymer has an interactive group as described above. In the invention, an acrylic resin is preferably used in terms of effectively imparting the cured layer with such properties as adsorbing a plating catalyst or adhering to a metal film formed thereon, and also improving the flexibility of the cured layer. Specific examples of the acrylic resin include a polymer to which an interactive group as mentioned above is introduced. More specifically, a homopolymer or a copolymer formed including a monomer having a cyano group as mentioned below is preferable.

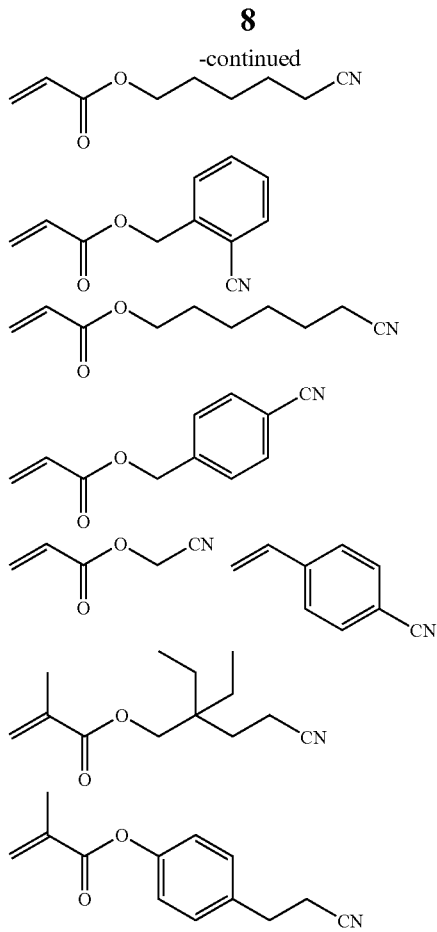

In step (1) of Method I, it is preferable to use a polymer having an interactive group from the viewpoint of introducing more interactive groups in the cured layer. It is also possible to introduce an interactive group in the cured layer by using a monomer having an interactive group in step (2a), however, since a monomer has a low molecular weight, it may be removed during the development if it has not been not reacted. On the other hand, since a polymer has a high molecular weight, the polymer is less likely to be removed during the development even if it has not been reacted. Accordingly, it is possible to introduce more interactive groups in the cured layer by using a polymer having an interactive group, as compared with the case in which a monomer having an interactive group is used. Further, it is preferable to use a polymer having an interactive group and a monomer having an interactive group in combination, from the viewpoint of introducing even more interactive groups in the cured layer.

In step (2a) of Method I, a monomer having an interactive group or a monomer having no interactive group is used.

The type of the monomer having no interactive group used in step (2a) is not particularly limited as long as the monomer is a radical-polymerizable compound that has at least one ethylenic unsaturated double bond and has no interactive group.

The monomer having no interactive group may be selected from the compound having at least one, preferably two or more, of an ethylenic unsaturated double bond at a terminal end. In the invention, a polyfunctional monomer having two ore more radical polymerizable groups are preferable in terms of reactivity. Examples of such a monomer are widely known in the field of the art, and any of these may be used in the invention without particularly limited.

Examples of the monomer include unsaturated carboxylic acids such as acrylic acid, methacrylic acid, itaconic acid, crotonic acid, isocrotonic acid, and maleic acid, esters thereof, and amides thereof. Among these, esters of an unsaturated carboxylic acid and an aliphatic polyalcohol, and amides of an unsaturated carboxylic acid and an aliphatic polyamine are preferable.

Further, an addition reaction product of an ester or amide of unsaturated carboxylic acid having a nucleophilic group such as a hydroxyl group, amino group or mercapto group as a substituent and a mono functional or polyfunctional carboxylic isocyanate or epoxy, or a dehydration reaction product of an ester or amide of unsaturated carboxylic acid having a nucleophilic group such as a hydroxyl group, amino group or mercapto group as a substituent and a monofunctional or polyfunctional carboxylic acid are also preferably used.

Moreover, an addition reaction product of an ester or amide of unsaturated carboxylic acid having an electrophilic group such as an isocyanate group or epoxy group and a monofunctional or polyfunctional alcohol, amine or thiol, and a substitution reaction product of an ester or amide of unsaturated carboxylic acid having a leaving group such as a halogen group or a tosyloxy group and a monofunctional or polyfunctional alcohol, amine or thiol are also preferably used.

Compounds in which the unsaturated carboxylic acid as mentioned above is changed to unsaturated phosphonic acid or styrene are also applicable.

Specific examples of the radical polymerizable compound, which is an ester formed from an aliphatic polyalcohol and an unsaturated carboxylic acid, include the following compounds.

Acrylates such as ethylene glycol diacrylate, 1,3-butane diol diacrylate, propylene glycol diacrylate, neopentyl glycol diacrylate, trimethylol propane triacrylate, trimethylol ethane triacrylate, hexane diol diacrylate, 1,4-cyclohexane diol diacrylate, pentaerythritol tetraacrylate, dipentaerythritol hexaacrylate, sorbitol hexaacrylate, polyester acrylate oligomers, and the like.

Methacrylates such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol tetramethacylate, dipentaerythritol hexamethacrylate, sorbitol hexamethacrylate, and the like.

Itaconates such as ethylene glycol diitaconate, propylene glycol diitaconate, 1,3-butanediol diitaconate, 1,4-butanediol diitaconate, tetramethylene glycol diitaconate, pentaerythritol tetraitaconate, sorbitol hexaitaconate, and the like.

Crotonates such as ethylene glycol dicrotonate, tetramethylene glycol dicrotonate, pentaerythritol tetracrotonate, sorbitol hexacrotonate, and the like.

Isocrotonates such as ethylene glycol diisocrotonate, pentaerythritol tetraisocrotonate, sorbitol hexaisocrotonate, and the like.

Maleates such as ethylene glycol dimaleate, triethylene glycol dimaleate, pentaerythritol tetramaleate, sorbitol hexamaleate, and the like.

Other favorable examples of the ester include aliphatic alcohol-based esters described in Japanese Patent Publication Nos. 46-27926 and 51-47334, and JP-A No. 57-196231, esters having an aromatic skeleton described in JP-A Nos. 59-5240, 59-5241 and 2-226149, and esters described in JP-A No. 1-165613.

Specific examples of the amide monomer formed from an aliphatic polyamine compound and an unsaturated carboxylic acid include methylene bis-acrylamide, methylene bis-methacrylamide, 1,6-hexamethylene bis-acrylamide, 1,6-hexamethlene bis-methacrylamide, diethylene triamine trisacrylamide, xylylene bis acrylamide, xylylene bis methacrylamide, and the like.

Other favorable examples of the amide-based monomer include those having a cyclohexylene structure as described in Japanese Patent Publication No. 54-21726.

Further, urethane-based addition polymerizable compounds are also preferably used, and examples thereof include a vinyl urethane compound having two or more polymerizable vinyl groups in a molecule that is obtained from adding a hydroxyl group-containing vinyl monomer represented by the following Formula (a) to a polyisocyanate compound having two or more isocyanate groups in a molecule, as described in Japanese Patent Publication No. 48-41708.

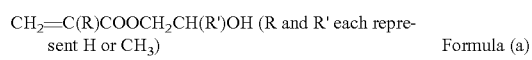

$CH_2$=C(R)COOCH$_2$CH(R')OH (R and R' each represent H or $CH_3$)     Formula (a)

The type of the monomer having an interactive group used in step (2a) is not particularly limited as long as the monomer is a radical polymerizable compound having at least one ethylenic unsaturated double bond and an interactive group. Specifically, for example, a monomer obtained by introducing an interactive group (non-dissociative functional group) in the aforementioned monomer having no interactive group by substitution may be used. More specifically, a monomer having a cyano group, which is favorably used in synthesizing the polymer having an interactive group as mentioned above, is preferable.

Combination of Polymer, Monomer and Interactive Group-Containing Compound in Method II In step (1) of Method II of the invention, a polymer having a functional group that reacts with a reactive group in the interactive group-containing compound, or a polymer that does not have the above functional group is used.

The polymer itself may have an interactive group or may not have an interactive group. Such a polymer is obtained by, for example, introducing a functional group that reacts with a reactive group in the interactive group-containing compound to the polymer having an interactive group or the polymer having no interactive group used in step (1) of Method I.

In step (2b) of Method II, a monomer having a functional group that reacts with a reactive group in the interactive group-containing compound, or a monomer that does not have such a functional group is used.

The monomer itself may have an interactive group or may not have an interactive group. Such a monomer is obtained by, for example, introducing a functional group that reacts with a reactive group in the interactive group-containing compound to the monomer having an interactive group or the monomer having no interactive group used in step (2a) of Method I.

In step (2b), an interactive group-containing compound is used. The interactive group-containing compound has an interactive group as mentioned above and a reactive group that reacts with a monomer or polymer to form a covalent bond. Examples of the interactive group-containing compound include the following.

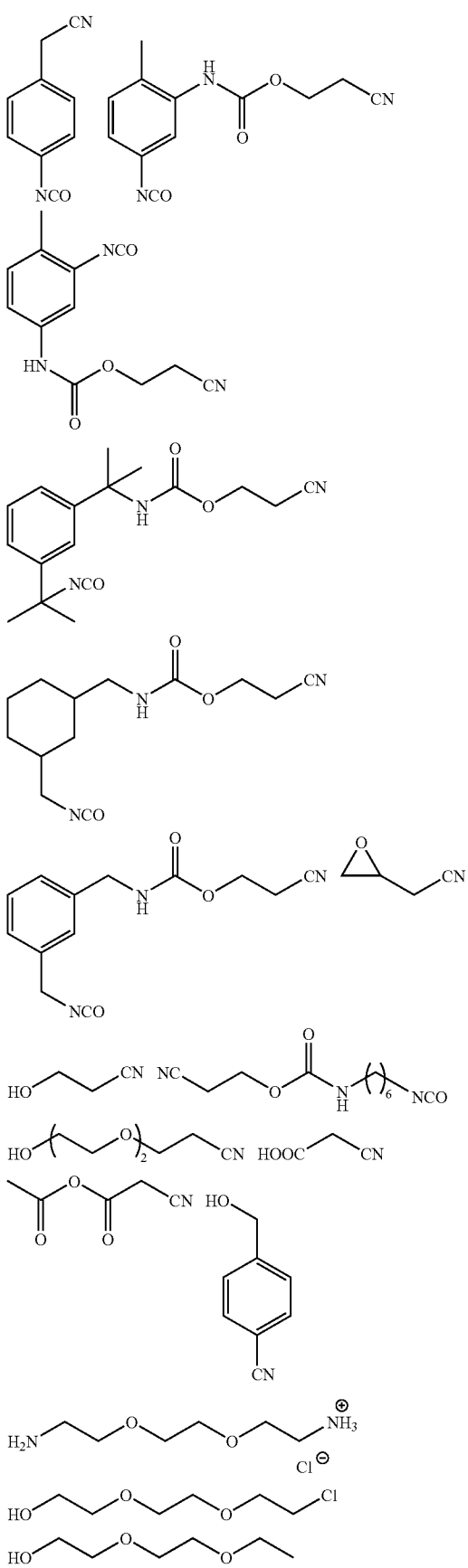

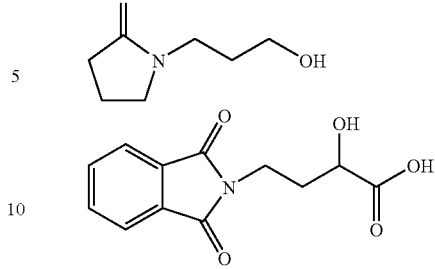

Examples of the combination of the reactive group in the interactive group-containing compound and the functional group in the polymer or monomer that reacts with the reactive group (functional group in the polymer and/or monomer, reactive group in the interactive group-containing compound) include: (—COOH, amine), (—COOH, aziridine), (—COOH, isocyanate), (—COOH, epoxy), (—NH$_2$, isocyanate), (—NH$_2$, aldehydes), (—NCO, amine), (—NCO, isocyanate), (—NCO, alcohol), (—NCO, epoxy), (—OH, alcohol), (—OH, halogenated compound), (—OH, amine), (—OH, acid anhydride) and (—OH, isocyanate). Among these, a combination of (—OH, isocyanate) is preferable in view of achieving high reaction efficiency.

The timing of reacting the interactive group-containing compound with the polymer or monomer is not particularly limited, but it is preferable to carry out the reaction at the time of applying and drying the composition, in order to avoid the inclusion of an additional step in the process.

Step (3)

In step (3) of Methods I and II of the invention, the curable layer is formed on the substrate by applying the composition that has been prepared in step (2a) or (2b) onto the substrate, then drying and curing the composition.

In this step, the application of the composition may be performed a known method such as spin coating, bar coating, coater coating or the like. The application amount of the composition is preferably 0.1 to 5 μm, more preferably 0.5 to 2 μm.

The drying temperature is preferably 50 to 150° C., more preferably 70 to 100° C. The drying time is preferably 1 minute to 1 hour, more preferably 1 minute to 10 minutes.

The layer that has been dried is cured by applying energy to the layer by means of heating or exposing to light.

The application of energy may be conducted by applying radiation rays such as heat or light, for example, irradiation with a UV lamp or visible light or heating with a hot plate may be applicable. Examples of the light source include a mercury lamp, a metal halide lamp, a xenon lamp, a chemical lamp, a carbon arc lamp, and the like. Examples of the radiation rays include electron beam, X ray, ion beam, infrared ray, and the like. Further, g-line ray, i-line ray, deep-UV ray, high-density energy beam (laser beam) are also applicable.

The application of energy may be favorably conducted by directly recording imagewise with a thermal recording head or the like, scan-exposing to infrared laser beam, conducting high-illuminance flash exposure with a xenon discharge lamp, conducting exposure with an infrared lamp, or the like.

The time for application of energy is, although it depends on the curing property of the desired layer or the type of light source, normally 10 seconds to 5 hours.

Substrate

The "substrate" used in the invention is not particularly limited as long as it can retain the shape thereof, and preferably has a surface having a function of reacting with the monomer that is used in the formation of the cured layer to form a chemical bond. Specifically, the substrate itself may have the aforementioned surface property, or an intermediate layer having the same property (for example, a polymerization initiation layer as described later) may be formed on a base material for the substrate.

Base Material and Substrate

The base material used in the invention is preferably a dimensionally stable plate-shaped object, and examples thereof include a sheet of paper, a sheet of paper laminated with a plastic (for example, polyethylene, polypropylene, polystyrene and the like), a plate of a metal (for example, aluminum, zinc, copper and the like), a film of a plastic (for example, cellulose diacetate, cellulose triacetate, cellulose propionate, cellulose butyrate, cellulose acetate, nitrocellulose, polyethylene terephthalate, polyethylene, polystyrene, polypropylene, polycarbonate, polyvinylacetal, polyimide, epoxy resin, bismaleimide resin, polyphenylene oxide, liquid crystal polymer, polytetrafluoroethylene and the like), a film of paper or plastic onto which a metal as mentioned above is laminated or deposited, and the like. The base material to be used in the invention is preferably made of an epoxy resin or a polyimide resin.

When a surface of the base material has a function of reacting with the monomer used in the formation of the cured layer to form a chemical bond, the base material itself may be used as the substrate.

The base material containing a polyimide having a polymerization initiation site in the skeleton thereof, as described in paragraphs [0028] to [0088] of JP-A No. 2005-281350, may also be used for the substrate.

The metal pattern material obtained by the method of producing a metal pattern material of the invention may be applied to a semiconductor package, various kinds of electrical wiring boards, and the like. When the metal pattern material is used in such applications, it is preferable to use a substrate including an insulating resin, as shown below. Specifically, it is preferable to use a substrate formed from an insulating resin, or a substrate having a layer formed from an insulating resin on a base material.

The substrate formed from an insulating resin or the layer formed from an insulating resin may be formed using a known insulating resin composition. The insulating resin composition may include an additive of various kinds in combination with the resin as a main component, according to purposes. For example, a polyfunctional acrylate monomer may be added for the purpose of increasing the strength of the insulating layer, or inorganic or organic particles may be added for the purpose of increasing the strength of the insulating layer and improving the electrical properties thereof.

Here, the "insulating resin" according to the invention means a resin having an insulating property that is tolerable for use in known insulating films or insulating layers. Therefore, the resin does not have to be completely insulating, as long as it has an insulating property that satisfies the requirements according to purposes.

The insulating resin may be a thermosetting resin, a thermoplastic resin, or a mixture thereof. Specifically, examples of the thermosetting resin include epoxy resins, phenolic resins, polyimide resins, polyester resins, bismaleimide resins, polyolefin-based resins, isocyanate-based resins, and the like.

Examples of the epoxy resins include cresol novolac type epoxy resins, bisphenol A type epoxy resins, bisphenol F type epoxy resins, phenol novolac type epoxy resins, alkylphenol novolac type epoxy resins, biphenol F type epoxy resins, naphthalene type epoxy resins, dicyclopentadiene type epoxy resins, epoxides of a condensate formed from a phenol and an aromatic aldehyde having a phenolic hydroxyl group, triglycidyl isocyanurate, alicyclic epoxy resins, and the like. These may be used alone, or may be used in combination of two or more species. By including the insulating resin as mentioned above, excellent heat resistance or the like may be obtained.

Examples of the polyolefin-based resins include polyethylene, polystyrene, polypropylene, polyisobutylene, polybutadiene, polyisoprene, cycloolefin-based resins, copolymers of these resins, and the like.

Examples of the thermoplastic resins include phenoxy resins, polyether sulfone, polysulfone, polyphenylene sulfone, polyphenylene sulfide, polyphenyl ether, polyether imide, and the like.

Other thermoplastic resins include 1,2-bis(vinylphenylene)ethane resin, or a modified resin obtained from the 1,2-bis(vinylphenylene)ethane resin and a polyphenylene ether resin (described in Satoru Amou et al., Journal of Applied Polymer Science, Vol. 92, pp. 1252-1258 (2004)), liquid crystal polymers (for example, VECSTAR, trade name, manufactured by Kuraray Co., Ltd.), fluororesins (PTFE), and the like.

The thermoplastic resin and the thermosetting resin may be used in combination for the purpose of compensating the defects of each resin to achieve better effects. For example, since a thermoplastic resin such as polyphenylene ether (PPE) has low resistance to heat, alloying with a thermosetting resin or the like may be carried out, such as alloying of PPE with epoxy or triallyl isocyanate, or alloying of a PPE resin to which a polymerizable functional group has been introduced with another thermosetting resin. Further, a cyanate ester is a resin that exhibits the most excellent dielectric properties among the thermosetting resins, but is hardly used alone and mainly used as a modified resin of epoxy resins, maleimide resins, thermoplastic resins and the like. Details of these resins are described in "Electronic Technology" No. 2002/9, p. 35. Furthermore, a mixture containing an epoxy resin and/or a phenolic resin as a thermosetting resin, and a phenoxy resin and/or polyethersulfone (PES) as a thermoplastic resin, may also be used for the purpose of improving dielectric properties.

The insulating resin composition may include a compound containing a polymerizable double bond in order to promote crosslinking reaction. Specific examples of the compound include an acrylate or methacrylate compound, particularly preferably a polyfunctional acrylate or methacrylate compound. Other applicable compounds containing a polymerizable double bond include those obtained by subjecting a part of a thermosetting resin or a thermoplastic resin (for example, an epoxy resin, a phenolic resin, a polyimide resin, a polyolefin resin, or a fluororesin) to a (meth)acrylation reaction using methacrylic acid, acrylic acid or the like.

A composite of a resin and other component may also be used as the insulating resin composition for the purpose of reinforcing the properties of a resin film, such as mechanical strength, heat resistance, weather resistance, flame retardancy, water resistance or electrical properties. Examples of the material that may be used for producing a composite include paper, glass fiber, silica particles, phenolic resins, polyimide resins, bismaleimide triazine resins, fluororesins, polyphenylene oxide resins, or the like.

Further, the insulating resin composition may be compounded with, if necessary, one or more kind of filler for use in general resin materials for wiring boards. Examples of the filler include inorganic fillers such as silica, alumina, clay, talc, aluminum hydroxide and calcium carbonate, and organic fillers such as cured epoxy resin, crosslinked benzoguanamine resin and crosslinked acrylic polymer. Among them, silica is preferably used as the filler.

The insulating resin composition may also include one or more additive of various kinds as necessary, such as a colorant, a flame retardant, a tackifier, a silane coupling agent, an antioxidant, an ultraviolet absorbent, and the like.

When these materials are added to the insulating resin composition, the total amount of the same is preferably 1 to 200% by mass, more preferably 10 to 80% by mass, with respect to the amount of the resin. If the above amount is less than 1% by mass, effects of reinforcing the aforementioned properties may not be achieved, while if the above amount is more than 200% by mass, properties that are inherent to the resin, such as strength, may deteriorate.

It is preferable that the substrate for use in the aforementioned applications is formed from an insulating resin having a dielectric constant (relative dielectric constant) at 1 GHz of 3.5 or less, or has a layer formed from the insulating resin on a base material. Further, it is preferable that the substrate is formed from an insulating resin having a dielectric loss tangent at 1 GHz of 0.01 or less, or has the layer formed from the insulating resin on a base material.

The dielectric constant and the dielectric loss tangent of an insulating resin may be measured by standard methods. For example, the properties may be measured by using a cavity resonator perturbation method (for example, a $\in r \tan \delta$ measuring device for a ultra-thin sheet, manufactured by Keycom Corp.).

As mentioned above, it is also advantageous to select the insulating resin material from the viewpoint of dielectric constant or dielectric loss tangent. Examples of the insulating resin having a dielectric constant of 3.5 or less and a dielectric loss tangent of 0.01 or less include liquid crystal polymers, polyimide resins, fluororesins, polyphenylene ether resins, cyanate ester resins, and bis(bisphenylene)ethane resins, and modified resins of these resins.

The substrate for use in the invention preferably has a surface roughness of 500 nm or less, more preferably 100 nm or less, even more preferably 50 nm or less, and most preferably 20 nm or less, in view of applications to semiconductor packages, various electrical wiring boards, and the like. The surface roughness of the substrate (when an intermediate layer or a polymerization initiation layer is provided, the surface roughness of that layer) is preferably smaller, since the electric loss at the time of transmitting electricity at high frequency may be smaller when the metal pattern material is used for wiring lines or the like.

When the substrate has a shape of a plate such as a resin film (plastic film), a cured layer may be formed on both sides of the substrate by conducting step (3) to both sides thereof. Further, by conducting the later-described steps (4) and (5) to the both sides of the substrate, a metal plated material having a metal film on both sides thereof may be obtained.

In the invention, the substrate preferably has a polymerization initiation layer thereon in order to react with the monomer used in the formation of the cured layer to form a chemical bond. The polymerization initiation layer contains a polymerization initiator or a functional group capable of initiating polymerization. By using the substrate having the polymerization initiation layer, active sites may be efficiently generated to achieve favorable bond between the substrate and the monomer.

Hereinafter, the polymerization initiator layer according to the invention will be described. When the base material is a plate-shaped object, the polymerization layer may be formed on both sides thereof.

(Polymerization Initiation Layer)

Examples of the polymerization initiation layer according to the invention include a layer containing a polymer compound and a polymerization initiator; a layer containing a polymerizable compound and a polymerization initiator; and a layer containing a functional group capable of initiating polymerization.

The polymerization initiation layer according to the invention may be formed by preparing a composition by dissolving necessary components in a solvent capable of dissolving them, applying the same onto the surface of a base material by coating or the like, and curing the formed film by heating or irradiating with light.

The compound to be used in the polymerization initiation layer according to the invention is not particularly limited, as long as it exhibits a favorable adhesion to the base material and generates an active species upon application of energy such as actinic rays. Specific examples thereof include a mixture of a polyfunctional monomer or a hydrophobic polymer having a polymerizable group in the molecule with a polymerization initiator.

Specific examples of the hydrophobic polymer having a polymerizable group in the molecule include diene-based homopolymers such as polybutadiene, polyisoprene and polypentadiene, homopolymers of an allyl group-containing monomer such as allyl (meth)acrylate and 2-allyloxyethyl methacrylate;

bicomponent or multicomponent copolymers of styrene, (meth)acrylic acid ester, (meth)acrylonitrile and the like, containing a diene-based monomer such as butadiene, isoprene or pentadiene, or an allyl group-containing monomer as a constituent unit; and linear polymers or terpolymers having a carbon-carbon double bond in the molecule such as unsaturated polyesters, unsaturated polyepoxides, unsaturated polyamides, unsaturated polyacrylics, and high density polyethylene.

In the present specification, when referring to both or either one of "acryl" and "methacryl", the term "(meth)acryl" is used sometimes.

The content of the polymerizable compound is preferably in the range of 10 to 100% by mass, and particularly preferably 10 to 80% by mass, in terms of the solid content in the polymerization initiation layer.

The polymerization initiation layer contains a polymerization initiator in order to express a polymerization initiation ability upon application of energy. The polymerization initiator used here may be appropriately selected from known thermal polymerization initiators, photopolymerization initiators or the like that express a polymerization initiation ability upon application of predetermined energy, such as actinic rays, heat, electron beams or the like, according to purposes. Among them, photopolymerization is favorably used from the viewpoint of production suitability, and for this reason, it is preferable to use a photopolymerization initiator.

The photopolymerization initiator is not particularly limited as long as it is active to the actinic rays to be applied and generates an active species from the polymerization initiation layer including the same. Examples thereof include a radical polymerization initiator, an anionic polymerization initiator, a cationic polymerization initiator, or the like. From the viewpoints of handleability or reactivity, a radical polymerization initiator and a cationic polymerization initiator are preferred, and a radical polymerization initiator is more preferred.

Specific examples of the photopolymerization initiator include acetophenones such as p-tert-butyltrichloroacetophenone, 2,2'-diethoxyacetophenone, and 2-hydroxy-2-methyl-1-phenylpropan-1-one; ketones such as benzophenone, 4,4'- bisdimethylaminobenzophenone, 2-chlorothioxanthone, 2-methylthioxanthone, 2-ethylthioxanthone and 2-isopropylthioxanthone; benzoin ethers such as benzoin, benzoin methyl ether, benzoin isopropyl ether and benzoin isobutyl ether; benzyl ketals such as benzyl dimethyl ketal and hydroxycyclohexyl phenyl ketone; sulfonium salts such as triphenylsulfonium chloride and triphenylsulfonium pentafluorophosphate, iodonium salts such as diphenyliodonium chloride and diphenyliodonium sulfate; and the like.

The content of the polymerization initiator is preferably in the range of 0.1 to 70% by mass, and particularly preferably in the range of 1 to 40% by mass, in terms of the solid content in the polymerization initiation layer.

The solvent to be used in the application of the polymerizable compound or the polymerization initiator is not particularly limited, as long as it can dissolve the component. From the viewpoints of readily conducting drying or handling, a solvent whose boiling point is not too high is preferred, and specifically, a solvent having a boiling point of about 40° C. to 150° C. may be appropriate.

Specific examples thereof include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, and the like.

These solvents may be used alone or as a mixture of two or more. The concentration of the solid component in the coating solution is suitably 2 to 50% by mass.

The amount of the polymerization initiation layer formed on the base material is, from the viewpoints of sufficiently expressing the polymerization initiation ability and preventing delamination of the layer by maintaining the film formation ability, preferably in the range of 0.1 to 20 g/m$^2$, more preferably 0.1 to 15 g/m$^2$, and even more preferably 0.1 to 2 g/m$^2$, based on the mass after being dried.

According to the invention, the polymerization initiation layer is formed by disposing the composition for forming a polymerization initiation layer on a base material by means of coating or the like, and removing the solvent in the composition to form a film, as described above. At this point, the curing of the film is preferably performed by heating and/or irradiating with light. In particular, it is preferable to conduct preliminary curing of the film by irradiating with light, after drying the film by heating, since curing of the polymerizable compound proceeds to a certain extent, thereby effectively suppressing the delamination of the polymerizable initiation layer with the cured layer to be formed thereon in a subsequent process.

The heating temperature and time may be selected so that the solvent used may be sufficiently dried, but in view of production suitability, the temperature is preferably 100° C. or less and the drying time is preferably 30 minutes or less, more preferably in the range of a drying temperature of 40 to 80° C. and a drying time of 10 minutes or less.

The light irradiation that is carried out as desired after the heating and drying may be performed by, for example, a mercury lamp, a metal halide lamp, a xenon lamp, a chemical lamp, a carbon arc lamp, or the like. Applicable radiation rays include electron beams, X-rays, ion beams, and far-infrared rays. Further, g-line rays, i-line rays, deep-UV light, high-density energy beams (laser beams) are also applicable.

It is preferable that the light irradiation is conducted in such a manner that the polymerization initiator included in the polymerization initiation layer is not completely consumed, even if it is radical-polymerized during curing the polymerizable compound. The time for light irradiation may vary depending on the intensity of the light source, but is generally preferably within 30 minutes. The preliminary curing may be conducted, for example, in such a manner that the residual ratio of the film after washing the solvent is 80% or less, and the residual ratio of the initiator after completing the preliminary curing is 1% or more.

In addition to the above-described polymerization initiation layer containing the polymerizable compound and the polymerization initiator, a polymerization initiation layer formed from a polymer having a polymerization initiating group in a side chain as a pendant group, as described in JP-A No. 2004-161995, is also preferable. Specifically, this polymer has a functional group having a polymerization initiation ability (polymerization initiating group) and a crosslinkable group in a side chain (hereinafter, referred to as polymerization initiating polymer). By using this polymer, it is possible to form a polymerization initiation layer having a polymerization initiation group that is bonded to a polymer chain, and the polymer chain is fixed by a crosslinking reaction. The polymerization initiation layer as mentioned above is also suitable as a polymerization initiation layer of the present application.

Examples of the polymerization initiating polymer used herein include those described in paragraphs [0011] to [0158] of JP-A No. 2004-161995. Specific examples of the preferred polymerization initiating polymer include those described below.

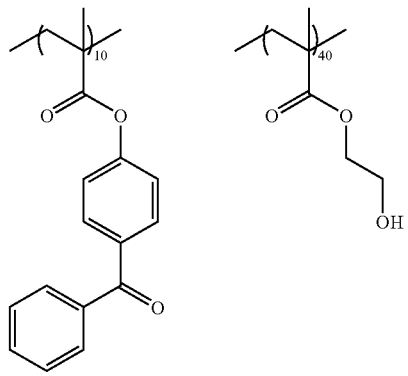

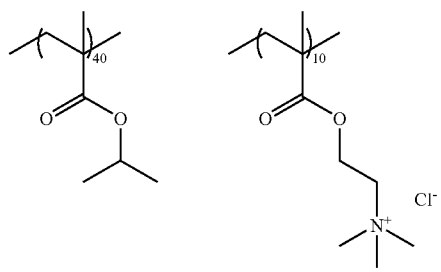

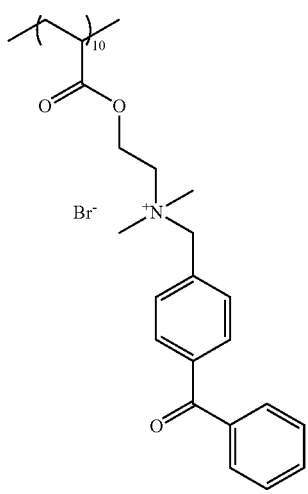
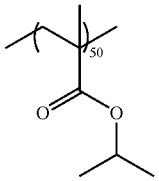
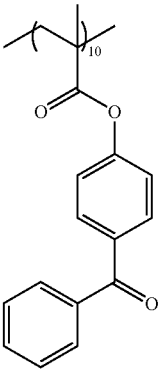
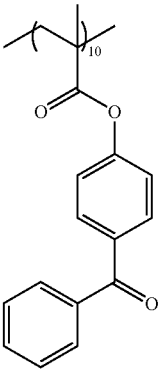
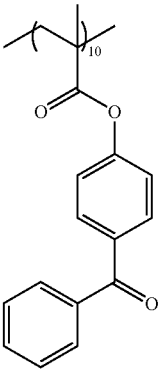
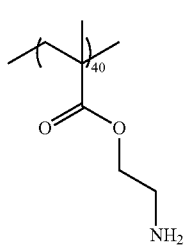
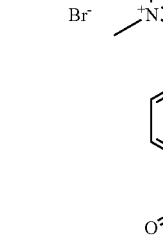
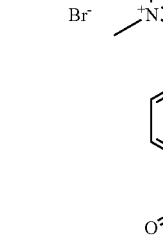
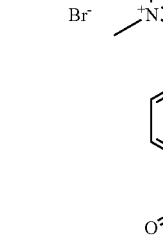
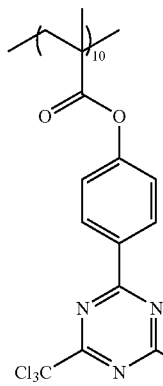
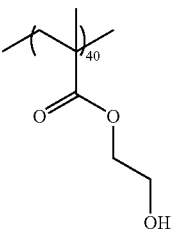
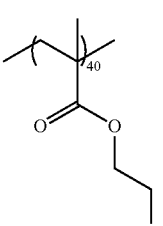
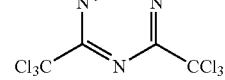
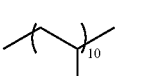
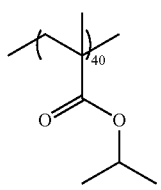
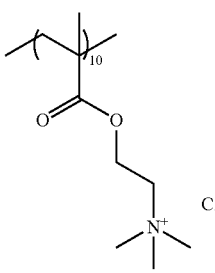
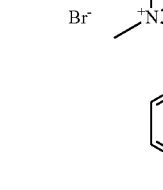
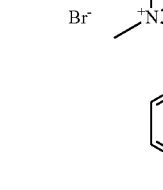
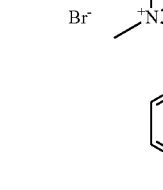

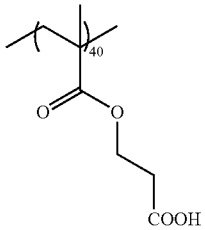

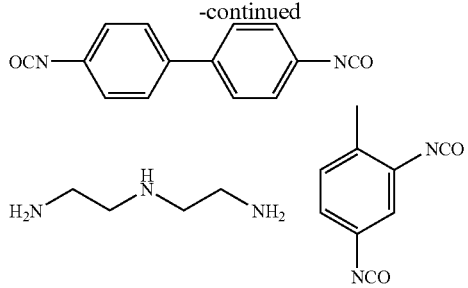

Film Formation of Polymerization Initiation Layer

The polymerization initiation layer formed by using the polymerization initiating polymer according to the invention is formed by dissolving the aforementioned polymerization initiating polymer in an appropriate solvent to prepare a coating solution, disposing the coating solution on a base material by coating or the like, removing the solvent, and allowing a crosslinking reaction to proceed. As the crosslinking reaction proceeds, the polymerization initiating polymer is fixed. The fixation due to the crosslinking reaction may be carried out by a method of using a self-condensation reaction of the polymerization initiating polymer, or a method of using a crosslinking agent in combination, and the method of using a crosslinking agent is preferable. One example of the method of using a self-condensation reaction of the polymerization initiating polymer is, when the crosslinkable group is —NCO, a method of using the property of promoting the self-condensation reaction upon heating. The progress of the self-condensation reaction results in the formation of a crosslinked structure.

Examples of the crosslinking agent used in the method of using a crosslinking agent in combination include conventionally known ones as described in the "Handbook of Crosslinking Agents," edited by Yamashita Shinji, or the like.

Examples of the preferred combination of the crosslinkable group in the polymerization initiating polymer and the crosslinking agent (crosslinkable group, crosslinking agent) include: (—COOH, polyvalent amine), (—COOH, polyvalent aziridine), (—COOH, polyvalent isocyanate), (—COOH, polyvalent epoxy), (—NH$_2$, polyvalent isocyanate), (—NH$_2$, aldehydes), (—NCO, polyvalent amine), (—NCO, polyvalent isocyanate), (—NCO, polyhydric alcohol), (—NCO, polyvalent epoxy), (—OH, polyhydric alcohol), (—OH, polyvalent halogenated compound), (—OH, polyvalent amine), and (—OH, acid anhydride). Among them, since urethane bonds are generated after crosslinking to form a high-strength crosslinked structure, a combination of (—OH, polyvalent isocyanate) is more preferred.

Specific examples of the crosslinking agent according to the invention include the compounds having the structures shown below:

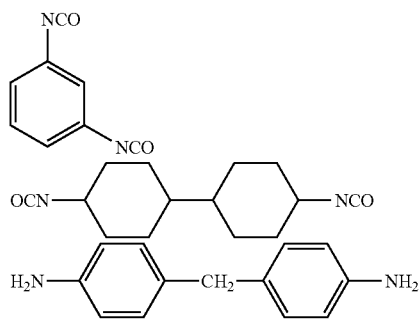

Such a crosslinking agent is added during the formation of the polymerization initiation layer, to the coating solution containing the aforementioned polymerization initiating polymer. Thereafter, a crosslinking reaction proceeds due to heat applied during the heating and drying of the film, and a firm crosslinked structure may be formed. More specifically, the crosslinking reaction proceeds based on the dehydration reaction shown as the following ex 1., or the addition reaction shown as the following ex 2., and a crosslinked structure is formed. In these reactions, the temperature condition is preferably 50° C. or higher and 300° C. or lower, and more preferably 80° C. or higher and 200° C. or lower.

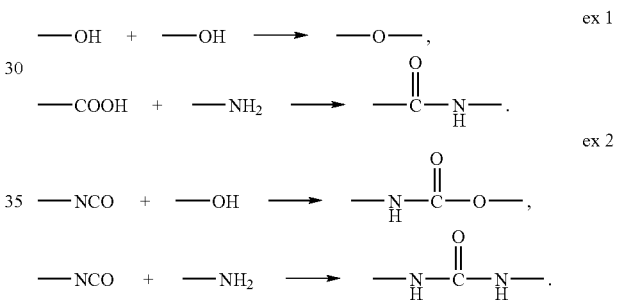

The amount of the crosslinking agent to be added in the coating solution may vary depending on the amount of the crosslinkable groups that have been introduced in the polymerization initiating polymer, but from the viewpoints of the degree of crosslinking or the influence of the remaining unreacted crosslinking components on the polymerization reaction, the amount of the crosslinking agent is preferably 0.01 to 50 equivalents, more preferably 0.01 to 10 equivalents, and even more preferably 0.5 to 3 equivalents, with respect to the number of moles of the crosslinkable group.

The solvent used for the application of the polymerization initiation layer is not particularly limited as long as the aforementioned polymerization initiating polymer is dissolved therein. From the viewpoints of the ease of drying and handleability, a solvent whose boiling point is not too high is preferred, specifically, a solvent having a boiling point of about 40° C. to 150° C. may be appropriately selected.

Specific examples of the solvent include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylelne glycol monoethyl ether, diethylene glycol dimethyl ether, diethylene glycol diethyl ether, propylene glycol monomethyl ether acetate, propylene glycol monoethyl ether acetate, 3-methoxypropyl acetate, and the like.

These solvents may be used alone or as a mixture of two or more kinds. The concentration of the solid component in the coating solution is suitably 2 to 50% by mass.

The application amount of the polymerization initiation layer formed from the polymerization initiating polymer is preferably 0.1 to 20 g/m$^2$, more preferably 1 to 15 g/m$^2$, based on the mass after drying, from the viewpoints of the initiation ability of an active species or film forming properties.

According to the invention, when the aforementioned substrate having a layer formed from an insulating resin on a base material is used, it is preferable that the layer formed from an insulating resin includes a known polymerization initiator so as to serve as an insulative polymerization initiation layer. The polymerization initiator to be included in the insulative polymerization initiation layer is not particularly limited, and examples thereof include the above-described thermal polymerization initiators, photopolymerization initiators (radical polymerization initiators, anionic polymerization initiators, and cationic polymerization initiators), the polymer compounds having an active carbonyl group in a side chain as described in JP-A No. 9-77891 and JP-A No. 10-45927, and further a polymer having a crosslinkable group and a functional group capable of initiating polymerization in a side chain (polymerization initiating polymer).

The amount of the polymerization initiator to be included in the insulative polymerization initiation layer is generally preferably about 0.1 to 50% by mass, more preferably about 1.0 to 30.0% by mass, in terms of the solid component in the insulating layer.

Step (4)

In step (4), a plating catalyst or a precursor thereof is applied to the cured layer formed in step (3). In this step, the interactive group in the cured layer attracts (adsorbs) the applied plating catalyst or the precursor thereof, according to the function of the group.

Examples of the plating catalyst or the precursor thereof include those that function as a catalyst or as an electrode for plating in the subsequent step (5) that will be described later. Therefore, the type of the plating catalyst or the precursor thereof is selected according to the type of plating performed in step (5).

Further, the plating catalyst or the precursor thereof used in this step is preferably an electroless plating catalyst or a precursor thereof.

(Electroless Plating Catalyst)

In the invention, the electroless plating catalyst may be any compound as long as it serves as an active core during performing electroless plating. Examples thereof include metals having a catalytic ability for a self-catalytic reduction reaction (metals capable of electroless plating and having an ionization tendency that is not more than that of Ni), and specific examples include Pd, Ag, Cu, Ni, Al, Fe, Co and the like. Among them, those capable of multidentate coordination are preferred. From the viewpoints of the number of types of a functional group capable of coordination and superiority in the catalytic ability, Pd is particularly preferred.

This electroless plating catalyst may be used in the form of a metal colloid. In general, a metal colloid may be produced by reducing metal ions in a solution containing a charged surfactant or a charged protective agent. The electrical charge of the metal colloid may be controlled by the surfactant or protective agent used herein.

(Electroless Plating Catalyst Precursor)

The electroless plating catalyst precursor used in this step is not particularly limited and may be any compound as long as it may serve as an electroless plating catalyst by a chemical reaction. In general, metal ions of the metals mentioned above as the electroless plating catalyst are used. A metal ion that serves as an electroless plating catalyst precursor becomes a zero-valent metal that serves as an electroless plating catalyst through a reduction reaction. The metal ion as an electroless plating catalyst precursor may be converted to a zero-valent metal to obtain an electroless plating catalyst by performing a separate reduction reaction, after being applied to the cured layer and prior to immersing in an electroless plating bath, or may be converted to a metal (electroless plating catalyst) while being immersed in an electroless plating bath by means of a reducing agent contained in the electroless plating bath.

Practically, the metal ion as an electroless plating catalyst precursor is provided onto the cured layer by using a metal salt. The metal salt to be used is not particularly limited as long as it may be dissolved in an appropriate solvent to dissociate into a metal ion and a base (anion). Specific examples thereof include $M(NO_3)_n$, $MCl_n$, $M_{2/n}(SO_4)$, $M_{3/n}(PO_4)$ (where M represents an n-valent metal atom). The resultant of dissociation of the above-mentioned metal salts may be suitably used as the metal ion. Specific examples of the metal ion include an Ag ion, a Cu ion, an Al ion, a Ni ion, a Co ion, a Fe ion, and a Pd ion. Among them, those capable of multidentate coordination are preferred. From the viewpoints of the number of types of a functional group capable of coordination and the catalytic ability, a Pd ion is particularly preferred.

One example of the method of providing a metal as an electroless plating catalyst or a metal ion as an electroless plating catalyst precursor to the cured layer is that in which a dispersion containing a metal dispersed in an appropriate dispersion solvent, or a solution containing a dissociated metal ion obtained by dissolving a metal salt in an appropriate solvent, is applied onto the cured layer, or the substrate with the cured layer formed thereon is immersed in the dispersion or the solution.

Alternatively, the metal as an electroless plating catalyst or the metal ion as an electroless plating catalyst precursor may be combined in the composition prepared in the preceding step (2a) or (2b). By forming the cured layer by applying the composition containing the metal or the metal ion, step (4) may be omitted.

When the substrate is formed from a resin film and the cured layer is formed on each side thereof, the application of an electroless plating catalyst or a precursor thereof is preferably performed by an immersion method in order to contact the electroless plating catalyst or the precursor thereof to the cured layer formed on each side of the substrate at the same time.

By performing the application of the electroless plating catalyst or the precursor thereof as described above, the electroless plating catalyst or the precursor thereof may be adsorbed to the interactive group in the cured layer by means of an interaction caused by an intermolecular force such as van der Waals force, or an interaction caused by a coordinate covalent bond due to lone pair electrons.

In view of achieving the adsorption sufficiently, the concentration of the metal in the dispersion, solution or composition, or the concentration of the metal ion in the solution, is preferably in the range of 0.001 to 50% by mass, and more preferably in the range of 0.005 to 30% by mass. The time for the contacting is preferably about 30 seconds to 24 hours, and more preferably about 1 minute to 1 hour.

(Other Catalysts)

When electroplating is performed instead of electroless plating in the subsequent step (5), a zero-valent metal may be used as the catalyst. Examples of the zero-valent metal include Pd, Ag, Cu, Ni, Al, Fe and Co. Among them, those capable of multidentate coordination are preferred. From the viewpoints of the adsorbability (attachability) to the interactive group (such as a cyano group) and the superiority in catalytic ability, Pd, Ag and Cu are particularly preferred.

Through the above-described step (4), an interaction between the interactive group (such as a cyano group) in the cured layer and the plating catalyst or a precursor thereof may be established.

Step (5)

In step (5), a plating film is formed by performing plating to the cured layer to which the electroless plating catalyst or the precursor thereof has been applied. The plating film thus formed exhibits excellent electroconductivity and adhesiveness.

Examples of the type of the plating performed in this step include electroless plating and electroplating, and may be selected according to the functions of the plating catalyst or the precursor thereof that has been interacting with the cured layer in the previous step (4).

That is, in this step, either electroplating or electroless plating may be performed to the cured layer to which the plating catalyst or the precursor thereof has been applied.

In the invention, it is preferable to perform electroless plating from the viewpoint of improving the formation of a hybrid structure that occurs in the cured layer or enhancing the adhesiveness. Further, in order to obtain a plating layer having a desired thickness, it is more preferable to perform electroplating after the electroless plating.

Hereinafter, the plating that is suitably carried out in this step will be described.

Electroless Plating

Electroless plating refers to an operation of precipitating a metal by means of a chemical reaction, using a solution in which ions of the metal to be precipitated is dissolved.

The electroless plating in this step is carried out by, for example, washing the substrate to which the electroless plating catalyst has been applied with water to remove excess electroless plating catalyst (metal), and then immersing the substrate in an electroless plating bath. A generally known electroless plating bath may be used as the electroless plating bath.

When a substrate to which an electroless plating catalyst precursor has been provided is immersed in the electroless plating bath, while the electroless plating catalyst precursor has been adsorbed or impregnated in the cured layer, the substrate is washed with water to remove excess precursor (metal salt or the like), and then is immersed in the electroless plating bath. In this case, reduction of the plating catalyst precursor and the subsequent electroless plating are carried out in the electroless plating bath. In this case, a generally known electroless plating bath may be used as the electroless plating bath also.

The reduction of the electroless plating catalyst precursor may be carried out in a separate process, prior to the electroless plating, by preparing a catalyst activating solution (reducing solution). The catalyst activating solution is a solution dissolving a reducing agent capable of reducing the electroless plating catalyst precursor (mainly a metal ion) to a zero-valent metal, and the concentration of the reducing agent is generally in the range of 0.1% by mass to 50% by mass, and is preferably in the range of 1% to 30%. Examples of the reducing agent that may be used include boron-based reducing agents such as sodium borohydride and dimethylamineborane, and reducing agents such as formaldehyde and hypophosphorous acid.

The composition of the electroless plating bath generally includes, as main components in addition to a solvent, a metal ion for the plating, a reducing agent, and an additive that enhances the stability of the metal ion (stabilizer). The electroless plating bath may further contain, in addition to the above components, a known additive such as a stabilizer for the plating bath.

The solvent used in the plating bath preferably includes an organic solvent that exhibits high affinity to the cured layer having low water absorbability and is highly hydrophobic. The type or the content of the organic solvent may be determined in accordance with the properties of the cured layer. In particular, when the cured layer has a high degree of saturated water absorption rate at a relative humidity of 25° C.-50%, the content of the organic solvent is preferably small.

Specifically, when the saturated water absorption rate at a relative humidity of 25° C.-50% of the cured layer is 0.01 to 0.5% by mass, the content of the organic solvent in the entire solvent in the plating bath is preferably 20 to 80% by mass; when the saturated water absorption rate at a relative humidity of 25° C.-50% of the cured layer is 0.5 to 5% by mass, the content of the organic solvent in the entire solvent in the plating bath is preferably 10 to 80% by mass; when the saturated water absorption rate at a relative humidity of 25° C.-50% of the cured layer is 5 to 10% by mass, the content of the organic solvent in the entire solvent in the plating bath is preferably 0 to 60% by mass; and when the saturated water absorption rate at a relative humidity of 25° C.-50% of the cured layer is 10 to 20% by mass, the content of the organic solvent in the entire solvent in the plating bath is preferably 0 to 45% by mass.

The organic solvent used in the plating bath needs to be miscible with water, and from that standpoint, ketones such as acetone, and alcohols such as methanol, ethanol and isopropanol are preferably used.

Examples of the metal used in the electroless plating bath include copper, tin, lead, nickel, gold, palladium and rhodium, and from the viewpoint of electrical conductivity, copper and gold are preferred.

Examples of the optimal reducing agent and additive in combination with the metal include, when the electroless plating bath uses copper, it includes $CuSO_4$ as a copper salt, HCOH as a reducing agent, and a chelating agent that serves as a stabilizer of copper ions such as EDTA or Rochelle salt, and trialkanolamine or the like. When the electroless plating bath uses CoNiP, it includes cobalt sulfate or nickel sulfate as a metal salt, sodium hypophosphite as a reducing agent, and sodium malonate, sodium malate or sodium succinate as a complexing agent. When the electroless plating bath uses palladium, it contains $(Pd(NH_3)_4)Cl_2$ as a metal ion, $NH_3$ or $H_2NNH_2$ as a reducing agent, and EDTA as a stabilizer. These plating baths may also include other components than the above-described components.

The thickness of the plating film formed by electroless plating may be controlled by adjusting the concentration of the metal ion in the plating bath, the immersion time in the plating bath, the temperature of the plating bath, or the like. From the viewpoint of electrical conductivity, the thickness of the plating film is preferably 0.5 μm or more, and more preferably 3 μm or more.

The immersion time in the plating bath is preferably about 1 minute to about 6 hours, and more preferably about 1 minute to about 3 hours.

By observing the cross-section with a scanning electron microscope (SEM), it may be confirmed that microparticles of the electroless plating catalyst or the plating metal are dispersed in the cured layer at high density, and that the plating metal is precipitated on the cured layer. Since the interface between the substrate and the plating film is in a hybrid state of the polymer and the microparticles, favorable adhesiveness may be achieved even when the interface between the substrate (organic component) and the inorganic substance (catalyst metal or plating metal) is flat and smooth (for example, the roughness is 500 nm or less).

(Electroplating)

In this step, if the plating catalyst or the precursor thereof applied during step (4) has a function as an electrode, electroplating may be performed to the cured layer to which the catalyst or the precursor thereof has been applied.

It is also possible to perform electroplating after performing the above-described electroless plating, by using a plating film that has been formed in the electroless plating as an electrode. In this case, a metal film may be easily formed to a desired thickness based on the plating film having excellent adhesiveness to the substrate. Therefore, it is possible to form a metal film to a desired thickness by performing electroplating after the electroless plating, which is advantageous to use the metal film of the invention in various applications.

The method of performing electroplating according to the invention may be a conventionally known method. Examples of the metal that may be used in the electroplating include copper, chromium, lead, nickel, gold, silver, tin, and zinc. From the viewpoint of electrical conductivity, copper, gold and silver are preferred, while copper is more preferred.

The thickness of the metal film obtained by electroplating may vary according to usage, and may be controlled by adjusting the concentration of the metal contained in the plating bath, current density, or the like. In the case of general electrical wiring lines or the like, the film thickness is preferably 0.5 µm or more, and more preferably 3 µm or more, from the viewpoint of electrical conductivity.

In the invention, by forming a fractal microstructure in the cured layer from a metal or a metal salt that is derived from the above-described plating catalyst or the precursor thereof and/or a metal that has precipitated in the cured layer by the electroless plating, adhesion between the metal film and the cured layer may be further enhanced.

Regarding the amount of metal in the cured layer, even higher adhesion may be achieved when the ratio of metal in a portion from the outermost surface of the cured layer to a depth of 0.5 µm is 5 to 50% by area, and the arithmetic average roughness Ra (JIS B 0633-2001, ISO 4288 (1996)) at an interface of the cured layer and the metal film is 0.05 µm to 0.5 µm, as observed in a photograph of a cross-section of the substrate with a metal microscope.

<Metal Plated Material>

By going through the respective processes of producing a metal plated material of the invention, a metal plated material of the invention may be obtained. Furthermore, if a resin film is used as the substrate, a metal plated material having a metal film formed on each side of the substrate may be obtained.

The metal plated material obtained by the process of producing a metal plated material of the invention exhibits excellent adhesion of a metal film to the substrate.

Further, since the cured layer includes a non-dissociative functional group as an interactive group, the cured layer exhibits low water-absorbancy and high hydrophobicity, and is less prone to change in response to changes in humidity. As a result, the metal plated material having the cured layer as mentioned above also has an effect that the adhesion is less prone to change due to changes in humidity.

The metal plated material may be used in various applications such as electromagnetic wave shielding films, coating films, dual-layer CCL materials, and electrical wiring materials.

The method of producing a metal pattern material of the invention includes etching the plating film, which has been formed through steps (1) to (5) of the method of producing the metal plated material of the invention, in a patterned manner (step (6)).

Step (6)

In step (6), the plating film (metal film) formed in step (5) is etched in a patterned manner. Specifically, in this step, a desired metal pattern may be formed by performing etching to remove an unnecessary portion of the plating film that has been formed over the entire surface of the substrate.

The formation of the metal pattern may be conducted by any technique, and examples thereof include a generally known subtractive method or a semi-additive method.

The subtractive method is a method of forming a metal pattern, the method including providing a dry film resist layer on the plating film; forming a dry resist pattern having the same pattern as that of the metal pattern from the dry resist layer by exposing the same to light in a patterned manner and developing the same; and then removing the plating film with an etching solution using the dry film resist pattern as a mask. The material for the dry film resist is not particularly limited, and any of a negative type, a positive type, a liquid-like or a film-like material may be used. The etching method may be any method that is used in the production of printed wiring boards, such as wet etching, dry etching or the like. From the viewpoint of operability, a wet etching method in which a simple device is used is preferred. The etching solution may be, for example, an aqueous solution of cupric chloride, ferric chloride, or the like.

The semi-additive method is a method of forming a metal pattern, the method including: providing a dry film resist layer on the plating film; forming a dry film resist pattern having the same pattern as that of a non-metal pattern portion from the dry film resist layer by exposing the same to light in a patterned manner and developing the same; performing electroplating by using the dry film resist pattern as a mask; performing quick etching after removing the dry film resist pattern; and then removing the plating film in a patterned manner. The materials for the dry film resist, etching solution or the like may be the same materials as those used in the subtractive method. The method of performing electroplating may be the method as mentioned above.

By going through steps (1) to (6) described above, a metal pattern material having a desired metal pattern may be produced.

It is also possible to produce a metal pattern material by a full-additive method, in which the cured layer is formed in a patterned manner in step (3), and the subsequent steps (4) and (5) are conducted to the patterned cured layer.

It is possible to form the cured layer with a pattern in step (3), specifically, by exposing the cured layer to light in a patterned manner and developing the unexposed portion to remove.

The development may be performed by, for example, immersing the material in a solvent capable of dissolving a component used for forming the cured layer such as a polymer or a monomer. The time for immersion is preferably from 1 minute to 30 minutes.

Alternatively, the cured layer may be formed by directly conducting patterning by a known application method, such as a gravure printing method, an inkjet method, or a spray coating method using a mask; applying energy to the same; and then washing (developing) the same.

The subsequent steps (4) and (5) for forming a plating film on the cured layer that has been formed in a patterned manner may be the same as those described above.

<Metal Pattern Material>

The metal pattern material of the invention is obtained by the method of producing a metal pattern material of the invention, and has a metal pattern that exhibits excellent adhesion to the substrate.

Since the cured layer has low water absorbance and high hydrophobicity, changes such as absorption of water or moisture does not occur in an exposed portion (portion in which no metal pattern is formed), and thus degradation in insulation reliability due to such changes may be avoided.

The metal pattern material of the invention preferably has a metal film (plating film) on the entire surface or a portion of the substrate having a surface roughness of 500 nm or less (more preferably, 100 nm or less). Furthermore, it is also preferable that the adhesiveness between the substrate and the metal pattern is 0.2 kN/m or more. These characteristics mean that the metal pattern material exhibits excellent adhesiveness between the substrate and the metal pattern, even if the surface of the substrate is flat and smooth.

Here, the surface roughness of the substrate is a value measured by cutting the substrate in a perpendicular manner to the substrate surface, and observing a cross-section thereof with an SEM.

More specifically, it is preferable that the surface of the substrate has a Rz as measured according to JIS B 0601 (ISO 4287 (1997)), which is a "difference between the average value of from the highest to the fifth highest point and the average value of from the lowest to the fifth lowest point in a designated plane", of 500 nm or less.

The value of adhesiveness between the substrate and the metal film may be measured by adhering a copper plate (thickness: 0.1 mm) to the surface of the metal film (metal pattern) with an epoxy-based adhesive (trade name: ARALDITE, manufactured by Huntsman Advanced Materials), drying the same for 4 hours at 140° C., and then performing a 90-degree peeling test based on JIS C 6481, or directly peeling off the edge portion of the metal film itself and performing the 90-degree peeling test based on JIS C 6481.

The metal pattern material obtained by the method of producing a metal pattern material of the invention may be used, for example, in semiconductor chips, electric wiring boards, FPCs, COFs, TABs, antennas, multilayer wiring substrates, mother boards, or the like.

The following are exemplary embodiments of the invention. However, the invention is not limited thereto.

1. A method of producing a metal plated material, the method comprising:
   preparing a polymer solution containing a polymer;
   preparing a composition by mixing the polymer solution with a monomer at an amount of from 30% by mass to 200% by mass with respect to the polymer, at least one of the polymer or the monomer having a non-dissociative functional group that interacts with a plating catalyst or a precursor thereof,
   forming a cured layer on a substrate by applying the composition, drying the composition and curing the composition;
   applying the plating catalyst or the precursor thereof to the cured layer; and
   conducting plating with respect to the plating catalyst or the precursor thereof to form a plating film on the cured layer.

2. The method according to 1, wherein the monomer comprises a polyfunctional monomer.
3. The method according to 1, wherein the monomer comprises a radical polymerizable monomer.
4. The method according to 1, wherein the substrate includes a polymerization initiation layer formed on a base material, the polymerization initiation layer comprising a polymerization initiator or a functional group capable of initiating polymerization, so that the substrate is chemically bonded with the cured layer.
5. The method according to 1, wherein the plating comprises electroless plating.
6. The method according to 5, further comprising conducting electroplating after the electroless plating.
7. The method according to 1, wherein the non-dissociative functional group comprises a cyano group.
8. A metal plated material obtained by the method according to 1.
9. A method of producing a metal pattern material, the method comprising etching the plating film of the metal plated material according to 1 in a patterned manner.
10. A metal pattern material formed by the method according to 9.
11. A method of producing a metal plated material, the method comprising:
    preparing a polymer solution containing a polymer;
    preparing a composition by mixing the polymer solution with a monomer at an amount of from 30% by mass to 200% by mass with respect to the polymer, and a compound having a non-dissociative functional group and a reactive group, the non-dissociative functional group being capable of interacting with a plating catalyst or a precursor thereof, and at least one of the polymer or the monomer having a functional group that reacts with the reactive group in the compound;
    forming a cured layer on a substrate by applying the composition, drying the composition and curing the composition;
    applying the plating catalyst or the precursor thereof to the cured layer; and
    conducting plating with respect to the plating catalyst or the precursor thereof to form a plating film on the cured layer.
12. The method according to 11, wherein the monomer comprises a polyfunctional monomer.
13. The method according to 11, wherein the monomer comprises a radical polymerizable monomer.
14. The method according to 11, wherein the substrate includes a polymerization initiation layer formed on a base material, the polymerization initiation layer comprising a polymerization initiator or a functional group capable of initiating polymerization, so that the substrate is chemically bonded with the cured layer.
15. The method according to 11, wherein the plating comprises electroless plating.
16. The method according to 15, further comprising conducting electroplating after the electroless plating.
17. The method according to claim 11, wherein the non-dissociative functional group comprises a cyano group.
18. A metal plated material obtained by the method according to 11.
19. A method of producing a metal pattern material, the method comprising etching the plating film of the metal plated material according to 18 in a patterned manner.
20. A metal pattern material formed by the method according to 19.

EXAMPLES

The invention will be explained in details with reference to the following Examples. However, the invention is not limited thereto. The term "%" and "part" refer to "% by mass" and "part by mass", respectively.

Example 1

<Synthesis of Polymer 1 Having Interactive Group (Cyano Group)>

Dimethyl carbonate (10 g) and acetonitrile (3.3 g) were placed into a 300 ml three-neck flask and were heated to a temperature of 70° C. under a nitrogen stream. Then, 2-cyanoethyl acrylate (40.0 g) and a solution of dimethyl carbonate 10 g/acetonitrile 3.3 g of 2,2'-azobis(2.4-dimethylvaleronitrile) (0.64 g) (trade name: V-65, manufactured by Wako Pure Chemical Industries, Ltd.) were dropped into the flask over four hours. After the completion of dropping, the content of the flask was stirred for another three hours. After the completion of reaction, the content of the flask was subjected to reprecipitation with water, and a solid content was recovered therefrom. A polymer having an interactive group (cyano group) was obtained at an amount of 31 g (Polymer 1). The weight average molecular weight of Polymer 1 was 55,000.

<Preparation of Substrate>

An epoxy-based insulation film (trade name: GX-13, manufactured by Ajinomoto Fine-Techno Co., Inc., thickness: 45 μm) was adhered onto a glass epoxy support as an electrically insulating layer, using a vacuum laminator by pressing at a pressure of 0.2 MPa and heating at a temperature of 100° C. to 110° C., and thus a base material was obtained.

Subsequently, a polymerization initiator-containing insulative composition having the following composition was applied onto the base material by a spin coating method to a thickness of 3 μm, which was then left to stand for 1 hour at 30° C. to remove the solvent and dried at 140° C. for 30 minutes, thereby forming a polymerization initiation layer (insulative polymerization initiation layer).

(Polymerization Initiator-Containing Insulative Composition)

The polymerization initiator-containing insulative composition was obtained by mixing the following components and stirring to completely dissolve.

| | |
|---|---|
| Liquid bisphenol A epoxy resin (trade name: EPIKOTE 825, manufactured by Japan Epoxy Resins Co., Ltd., epoxy equivalent: 176) | 5 g |
| MEK varnish of triazine structure-containing phenol novolac resin (trade name: PHENOLITE LA-7052, manufactured by DIC Corporation, non-volatile component: 62%, non-volatile phenolic hydroxyl group equivalent: 120) | 2 g |
| MEK varnish of phenoxy resin (trade name: YP-50EK35, manufactured by Tohto Kasei Co., Ltd., non-volatile component: 35%) | 10.7 g |
| Polymerization initiator (2-hydroxy-4'-(2-hydroxyethoxy)-2-methylpropiophenone | 2.3 g |
| MEK | 5.3 g |
| 2-ethyl-4-methyl imidazole | 0.053 g |

After the formation of the polymerization initiator layer, a curing treatment was conducted at 180° C. for 30 minutes, and Substrate A1 having a surface roughness (Rz) of 0.1 μm was obtained.

<Formation of Cured Layer>

(Preparation of Composition 1)

A polymer solution was prepared by mixing and stirring Polymer 1 (0.6 g) and acetone (10 g). Thereafter, a solution in which a polyfunctional monomer (A-TMMT, manufactured by Shin-Nakamura Chemical Co., Ltd.) (0.4 g) and a photopolymerization initiator (trade name: IRGACURE 184, manufactured by Ciba Japan, K.K.) (0.1 g) were dissolved in acetone (1 g) was added to the polymer solution to prepare Composition 1.

(Application and Drying)

Composition 1 thus obtained was applied onto the polymerization initiation layer of Substrate A1 to a thickness of 1 μm by a spin coat method, and was dried at 80° C. for five minutes.

(Exposure)

Subsequently, exposure was conducted using a 1.5 kW high-pressure mercury lamp (trade name: UVX-02516 SILP01, manufactured by Ushio Lighting, Inc.) for 40 seconds to form a cured layer onto an entire surface of the polymerization initiation layer of Substrate A1.

Thereafter, Substrate A1 with the cured layer formed thereon was immersed in acetone for five minutes while stirring, and then washed with distilled water. Substrate A2 having the cured layer was thus obtained.

<Application of Plating Catalyst>

Substrate A2 was immersed in an acetone solution containing 1% by mass of palladium nitrate for 30 minutes, and was then immersed in acetone and washed.

<Electroless Plating>

Substrate A2 with the cured layer to which a plating catalyst has been applied in the above process was subjected to electroless plating using an electroless plating bath having the following composition at 60° C. for five minutes. The thickness of the obtained electroless cupper plating film was 0.3 μm.

(Composition of Electroless Plating Bath)

| | |
|---|---|
| Distilled water | 859 g |
| Methanol | 850 g |
| Copper sulfate | 18.1 g |
| Ethylenediaminetetraacetic acid disodium salt | 54.0 g |
| Polyoxyethylene glycol (molecular weight: 1000) | 0.18 g |
| 2,2'-bipyridyl | 1.8 mg |
| 10% aqueous solution of ethylenediamine | 7.1 g |
| 37% aqueous solution of formaldehyde | 9.8 g |

The pH value of the electroless plating bath having the above composition was adjusted to 12.5 (60° C.) with sodium hydroxide and sulfuric acid.

Electroplating

Subsequently, electroplating was performed for 20 minutes using the electroless copper plating film as a power supply layer, in a copper electroplating bath having the following composition under the condition of 3 A/dm². The obtained copper electroplating film had a thickness of 18 μm.

Composition of Electroplating Bath

| | |
|---|---|
| Copper sulfate | 38 g |
| Sulfuric acid | 95 g |
| Hydrochloric acid | 1 mL |
| Copper Gleam PCM (trade name, manufactured by Meltex, Inc.) | 3 mL |
| Water | 500 g |

(Evaluation of Adhesiveness)

The 90° peel strength of the obtained plating film was measured at a width of 5 mm, using a tensile tester (trade name: RTM-100, manufactured by A&D Co., Ltd.) at a tensile strength of 10 mm/min. The result was 0.50 kN/m.

<Formation of Metal Pattern and Insulation Reliability Test>

An etching resist was formed onto a portion of the surface of the obtained plating film to be left as a metal pattern (wiring pattern), and a portion of the plating film at which no resist had been formed was removed with an etching solution containing $FeCl_3/HCl$. Subsequently, the etching resist was removed with an alkali peeling solution (3% NaOH solution). The resultant was covered with a solder resist to form a comb-shaped wiring pattern (metal pattern material) having a line-and-space of 200 μm/200 μm, for measuring the inter-wiring insulation reliability.

The obtained comb-shaped wiring pattern was left to stand for 100 hours in a HAST tester (trade name: AMI-150S-25, manufactured by ESPEC Corp.) at 125° C.-85% relative humidity (unsaturated), an applied voltage of 10 V, and a pressure of 2 atmospheres. As a result, no insulation defects among the wiring lines were observed.

Example 2

<Synthesis of Polymer 2 Having Reactive Group>

Dimethyl carbonate (28 g) was placed into a 300 ml three-neck flask and was heated to a temperature of 70° C. under a nitrogen stream. Then, 2-hydroxyethyl acrylate (29.7 g), t-butyl acrylate (8.2 g) and a solution of dimethyl carbonate 28 g of 2,2'-azobis(2,4-dimethylvaleronitrile) (0.79 g) (trade name: V-65, manufactured by Wako Pure Chemical Industries, Ltd.) were dropped into the flask over four hours. After the completion of dropping, the content of the flask was stirred for another three hours. After the completion of reaction, the content of the flask was subjected to reprecipitation with water, and a solid content was recovered therefrom. A polymer having a reactive group was obtained at an amount of 28 g (Polymer 2). The weight average molecular weight of Polymer 2 was 34,000.

Substrate A1 with a polymerization initiation layer was prepared in a similar manner to Example 1, and a metal plated material was prepared in the following manner.

<Formation of Cured Layer>

(Preparation of Composition 2)

A polymer solution was prepared by mixing and stirring Polymer 2 (0.6 g) and acetone (10 g). Thereafter, a solution in which a polyfunctional monomer (A-TMMT, manufactured by Shin-Nakamura Chemical Co., Ltd.) (0.4 g) and an interactive group-containing compound (4-hydroxybenzyl cyanide) (0.8 g) were dissolved in acetone (1 g) was added to the polymer solution to prepare Composition 2.

(Application and Drying)

Composition 2 thus obtained was applied onto the polymerization initiation layer of Substrate A1 to a thickness of 1 μm by a spin coat method, and was dried at 100° C. for 30 minutes. During this process, isocyanate groups in Polymer 2 and 4-hydroxybenzyl cyanide were allowed to react with each other.

(Exposure)

Thereafter, exposure was conducted using a 1.5 kW high-pressure mercury lamp (trade name: UVX-02516 SILP01, manufactured by Ushio Lighting, Inc.) for 40 seconds to form a cured layer onto an entire surface of the polymerization initiation layer of Substrate A1.

Then, Substrate A1 with the cured layer formed thereon was immersed in acetone for five minutes while stirring, and was then washed with distilled water. Substrate A3 having the cured layer was thus obtained.

Subsequently, the obtained Substrate A3 was subjected to application of a plating catalyst, electroless plating and electroplating, in a similar manner to Example 1.

(Evaluation of Adhesiveness)

The obtained plating film was subjected to evaluation of adhesiveness in a similar manner to Example 1. The resulting 90° peel strength was 0.42 kN/m.

Example 3

Substrate A1 with a polymerization initiation layer was prepared in a similar manner to Example 1, and a metal plated material was prepared in the following manner.

(Preparation of Composition 3)

A polymer solution was prepared by mixing and stirring poly-t-butyl acrylate (0.3 g) and acetone (10 g). Thereafter, a solution in which a polyfunctional monomer (A-TMMT, manufactured by Shin-Nakamura Chemical Co., Ltd.) (0.3 g) and an interactive group-containing compound (cyanoethyl acrylate) (0.4 g) were dissolved in acetone (1 g) was added to the polymer solution to prepare Composition 3.

(Application and Drying)

Composition 3 thus obtained was applied onto the polymerization initiation layer of Substrate A1 to a thickness of 1 μm by a spin coat method, and was dried at 80° C. for five minutes.

(Exposure)

Thereafter, exposure was conducted using a 1.5 kW high-pressure mercury lamp (trade name: UVX-02516 SILP01, manufactured by Ushio Lighting, Inc.) for 180 seconds to form a cured layer onto an entire surface of the polymerization initiation layer of Substrate A1.

Then, Substrate A1 with the cured layer formed thereon was immersed in acetone for five minutes while stirring, and was then washed with distilled water. Substrate A4 having the cured layer was thus obtained.

Subsequently, the obtained Substrate A4 with the cured layer was subjected to application of a plating catalyst, electroless plating and electroplating, in a similar manner to Example 1.

(Evaluation of Adhesiveness)

The obtained plating film was subjected to evaluation of adhesiveness in a similar manner to Example 1. The resulting 90° peel strength was 0.45 kN/m.

Example 4

A metal plated material was prepared in a similar manner to Example 3, except that the following Composition 4 was used in place of Composition 3.

(Preparation of Composition 4)

A polymer solution was prepared by mixing and stirring Polymer 1 as prepared in Example 1 (0.3 g) and acetone (10 g). Thereafter, a solution in which a polyfunctional monomer (A-TMMT, manufactured by Shin-Nakamura Chemical Co., Ltd.) (0.3 g) and an interactive group-containing compound (cyanoethyl acrylate) (0.4 g) were dissolved in acetone (1 g) was added to the polymer solution to prepare Composition 4.

(Evaluation of Adhesiveness)

The obtained plating film was subjected to evaluation of adhesiveness in a similar manner to Example 1. The resulting 90° peel strength was 0.55 kN/m.

Comparative Example 1

Substrate A1 with a polymerization initiation layer was prepared in a similar manner to Example 1, and a metal plated material was prepared in the following manner.

<Formation of Cured Layer>
(Preparation of Comparative Composition 1)

Comparative composition 1 was prepared by mixing and stirring a polyfunctional monomer (A-TMMT, manufactured by Shin-Nakamura Chemical Co., Ltd.) (0.2 g), an interactive group-containing compound (cyanoethyl acrylate) (0.8 g) and acetone (10 g).

(Application and Drying)

Comparative Composition 1 thus obtained was applied onto the polymerization initiation layer of Substrate A1 by a spin coat method. However, since the viscosity of the composition was too low and the film obtained by drying exhibited fluidity, the film was not able to be formed to a thickness of 1 μm. Therefore, the film was formed to a thickness of 0.1 μm and a metal plated material was obtained through the following processes.

(Exposure)

Exposure was conducted using a 1.5 kW high-pressure mercury lamp (trade name: UVX-02516 SILP01, manufactured by Ushio Lighting, Inc.) for 180 seconds to form a cured layer onto an entire surface of the polymerization initiation layer of Substrate A1.

Then, Substrate A1 with the cured layer formed thereon was immersed in acetone for five minutes while stirring, and was then washed with distilled water. Substrate A5 having the cured layer was thus obtained.

Subsequently, the obtained Substrate A5 was subjected to application of a plating catalyst, electroless plating and electroplating, in a similar manner to Example 1.

(Evaluation of Adhesiveness)

The obtained plating film was subjected to evaluation of adhesiveness in a similar manner to Example 1. The resulting 90° peel strength was 0.05 kN/m.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a metal plated material, the method comprising:
    preparing a polymer solution containing a polymer that has no polymerizable group;
    preparing a composition by mixing the polymer solution with a monomer at an amount of from 30% by mass to 200% by mass with respect to the polymer, at least one of the polymer or the monomer having a non-dissociative functional group that interacts with a plating catalyst or a precursor thereof;
    forming a cured layer on a substrate by applying the composition, in which the polymer and the monomer are mixed, drying the composition and curing the composition;
    applying the plating catalyst or the precursor thereof to the cured layer; and
    conducting plating with respect to the plating catalyst or the precursor thereof to form a plating film on the cured layer.

2. The method according to claim 1, wherein the monomer comprises a polyfunctional monomer.

3. The method according to claim 1, wherein the monomer comprises a radical polymerizable monomer.

4. The method according to claim 1, wherein the substrate includes a polymerization initiation layer formed on a base material, the polymerization initiation layer comprising a polymerization initiator or a functional group capable of initiating polymerization, so that the substrate is chemically bonded with the cured layer.

5. The method according to claim 1, wherein the plating comprises electroless plating.

6. The method according to claim 5, further comprising conducting electroplating after the electroless plating.

7. The method according to claim 1, wherein the non-dissociative functional group comprises a cyano group.

8. The method according to claim 1, wherein the polymer has the non-dissociative functional group that interacts with the plating catalyst or precursor thereof and has an acrylic structure in the main chain.

9. The method according to claim 8, wherein the polymer is a homopolymer formed by using a monomer having a cyano group.

10. The method according to claim 1, wherein the polymer has no non-dissociative functional group that interacts with the plating catalyst or precursor thereof and has an acrylic structure in the main chain.

* * * * *